United States Patent
Lu

(10) Patent No.: US 11,694,989 B2
(45) Date of Patent: Jul. 4, 2023

(54) DIE BONDING METHOD WITH CORNER OR SIDE CONTACT WITHOUT IMPACT FORCE

(71) Applicant: SAULTECH TECHNOLOGY CO., LTD., Hsinchu County (TW)

(72) Inventor: Yen Hao Lu, Hsinchu County (TW)

(73) Assignee: SAULTECH TECHNOLOGY CO., LTD., Zhubei (TW)

( * ) Notice: Subject to any disclaimer, the term of this patent is extended or adjusted under 35 U.S.C. 154(b) by 148 days.

(21) Appl. No.: 17/492,711

(22) Filed: Oct. 4, 2021

(65) Prior Publication Data

US 2022/0208722 A1 Jun. 30, 2022

Related U.S. Application Data

(60) Provisional application No. 63/130,617, filed on Dec. 25, 2020.

(51) Int. Cl.
*H01L 21/00* (2006.01)
*H01L 23/00* (2006.01)

(52) U.S. Cl.
CPC ............ *H01L 24/80* (2013.01); *H01L 24/74* (2013.01); *H01L 2224/8009* (2013.01); *H01L 2224/80895* (2013.01)

(58) Field of Classification Search
CPC combination set(s) only.
See application file for complete search history.

(56) References Cited

U.S. PATENT DOCUMENTS

2010/0244631 A1* 9/2010 Kobayashi ......... H03H 9/02015
29/25.35

* cited by examiner

*Primary Examiner* — Niki H Nguyen
(74) *Attorney, Agent, or Firm* — Lin & Associates Intellectual Property, Inc.

(57) ABSTRACT

A die bonding method with corner or side contact without impact force includes the steps: picking up a die by a die bonding device, wherein a surface of the die has no solder and bump; moving the die to one side of a die placement area of a substrate, wherein the substrate has no solder and bump; blowing one corner or one side of the die a positive pressure from the die bonding device to bend the corner/side to contact the die placement area; forming a bonding wave after the corner/side of the die contacting the die placement area, and spreading the bonding wave from the corner/side to opposite corner/side of the die, and separating the die from the die bonding device gradually and bonding the die on the die placement area; and bonding the die on the die placement area completely.

20 Claims, 23 Drawing Sheets

DIE BONDING METHOD WITH CORNER OR SIDE CONTACT WITHOUT IMPACT FORCE

BACKGROUND OF THE INVENTION

1. Field of the Invention

The present invention relates generally to a die-bonding method, and more particularly, to a die bonding method with the corner or side contact of the substrate without impact force.

2. The Prior Arts

The integrated circuit is fabricated on a semiconductor wafer is mass and through multiple processes, and then the wafer is further divided into a plurality of dies. In other words, the die is a small piece of unpackaged integrated circuit made of semiconductor materials. The divided dies are neatly attached to a carrier device, and then a carrier frame is responsible for transporting the carrier device, and then the dies are sequentially transferred to a plurality of dies placement area of a substrate to facilitate subsequent processing procedures.

Wafer-to-wafer direct bonding technology has been practiced for many years and belongs to the front-end process, which can facilitate the control of cleanliness and precision. Furthermore, the size of the wafer is usually 6 to 12 inches, which is relatively large, so it is relatively easy to control the generation of the bonding wave. The problem with wafer-to-wafer direct bonding is the difficulty to apply to a system on a die. The reason is that a single-die system is usually a combination of dies from different manufacturers. The cost to make different logic circuits with the same mask from the beginning is high.

The die-to-wafer bonding technology is a technology developed to integrate chiplets from different manufacturers, which can greatly save development costs, and can directly apply other manufacturers' existing chiplet solution in the single-die system manufacturing process without additional development of dedicated logic circuits. Therefore, the die-to-wafer bonding technology is the current development trend.

Because the traditional solder bonding technology is approaching the limit, in order to reduce the size of the die and the size of the contact, in the die-to-wafer bonding technology, the copper contact direct bonding technology (i.e., hybrid bonding technology) become the preferred solution.

However, compared to the wafer-to-wafer direct bonding technology, because the size of the die is smaller, the control of the bonding wave is quite difficult, so the hybrid bond suitable for die-to-wafer has not yet been successfully developed. The following will introduce three commonly used die-to-wafer bonding technologies.

The first die-to-wafer bonding technology is: the die bonding device first sucks the die from the carrier device, and then moves the die onto the substrate, so that the die directly contacts the substrate, and finally the die bonding device separates from the die so that the die is bonded on the substrate. The problem with this technology is that it is easy to cause the die and the substrate to jointly envelop the bubbles and generate voids, which causes the die and the substrate to not fully adhere to each other, and the subsequent processing procedures of the die are easily affected by the bubbles, thus reducing the yield rate of products made by subsequent processing.

The second die-to-wafer bonding technology is: the die bonding device transfers the die to the substrate in a way of tossing. The problem with this technology is: first, the die has a certain mass, and under the influence of gravity, the die falling to the die placement area with acceleration will produce a greater impact force, which makes the die contact the substrate with more force to cause damage; secondly, it is difficult for the die to be accurately placed on the die placement area.

The third die-to-wafer bonding technology is: the inside of the die bonding device is disposed with three elastic members, the elastic members are located on opposite sides of the surface to be bonded, the K value of the two peripheral elastic members is smaller than the K value of the central positioning elastic member, wherein the K value is the spring constant. When the die bonding device moves toward the substrate, the inertia deforms the elastic parts with different inner and outer K values, so that the center of the die first contacts the substrate, and then a bonding wave is generated, so that the die is accurately transferred to the die placement area. The problem with this technology is: first, when the die bonding device moves toward the substrate, the elastic members will provide a larger mass inertia of the die, which will cause the die to contact the substrate with a greater impact force and cause damage; second, because of the small size of the die bonding device, the elastic member is very small, difficult to assemble, and the manufacturing cost is relatively high.

In addition, in the above three die bonding methods, when the die is bonded to the substrate, the bonding speed of the die is too fast, causing the die to be easily damaged, skewed or bent.

SUMMARY OF THE INVENTION

A primary objective of the present invention is to provide a die bonding method with corner or side contact without impact force, which can control the corner or side of the die to contact the die placement area by the non-impact positive pressure, which provides the advantages of very small force, no damage to the die, no need to install the elastic member, and low manufacturing cost.

To achieve the foregoing objective, the present invention provides a die bonding method with corner or side contact without impact force, including the following steps: (a) picking up a die by a die bonding device, and wherein a surface of the die has no solder and bump; (b) moving the die to one side of a die placement area of a substrate by the die bonding device, and wherein the substrate has no solder and bump; (c) blowing one corner or one side of the die by a positive pressure provided from the die bonding device, thereby bending the corner or the side of the die to contact the die placement area; (d) forming a bond wave after the corner or the side of the die contacting the die placement area, and spreading the bond wave from the corner of the die to opposite corner of the die or from the side of the die to opposite side of the die, and separating the die from the die bonding device gradually and bonding the die on the die placement area; and (e) bonding the die on the die placement area completely.

To achieve the foregoing objective, the present invention provides a die bonding method with corner or side contact without impact force, including the following steps: (a) picking up a die by a die bonding device, and wherein a surface of the die has no solder and bump; (b) moving the die to one side of a die placement area of a substrate by the die bonding device, and wherein the substrate has no solder and bump; (c) blowing one corner or one side of the die by a positive pressure provided from the die bonding device, thereby bending the corner or the side of the die to contact the die placement area; (d) forming a bond wave after the corner or the side of the die contacts the die placement area, and spreading the bond wave from the corner of the die to opposite corner of the die or from the side of the die to opposite side of the die, then the positive pressure gradually weakens and further switches to a negative pressure, and separating the die from the die bonding device gradually and bonding the die on the die placement area; and (e) bonding the die on the die placement area completely.

The effect of the present invention is that the present invention can control the corner or side of the die to contact the die placement area by the positive pressure without impact force, and the force of the die contacting the substrate is limited to the mass of the die, which is extremely small, will not damage the die, and does not need to install elastic members, and the manufacturing cost is low.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
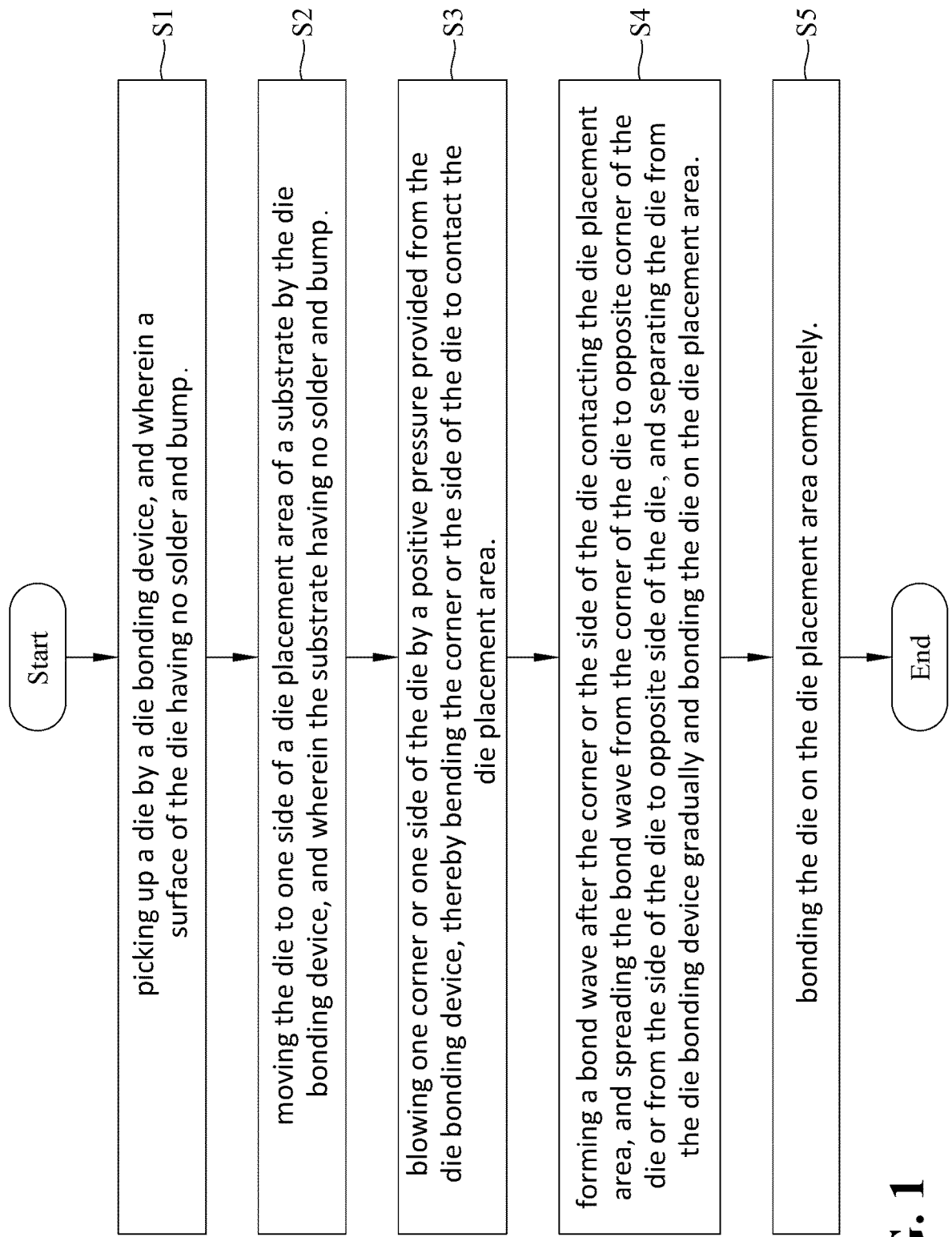
FIG. 1 is a flowchart of the die bonding method with corner or side contact without impact force according to an embodiment of the present invention.

The accompanying drawings are included to provide a further understanding of the invention, and are incorporated in and constitute a part of this specification. The drawings illustrate embodiments of the invention and, together with the description, serve to explain the principles of the invention.

Refer to FIGS. 1 to 10. The present invention provides a die bonding method with corner or side contact without impact force, including the following steps:

Step S1, as shown in FIGS. 1 to 4, a die bonding device 10 picks up a die 20, and the die 20 has a surface that is free of solder and bump. More specifically, there is a plurality of die 20 on a first surface 31 of a carrier device 30, and a corner 141 or side 151 of the die bonding device 10 and the rest adsorbs a corner 211 or a side 221 of the die 20 and the rest by a negative pressure 41 to bond the die 20 and pick up the die 20 from the carrier device 30. The carrier device 30 may be a carrier film, a carrier tray or a vacuum tray.

Figure 2:
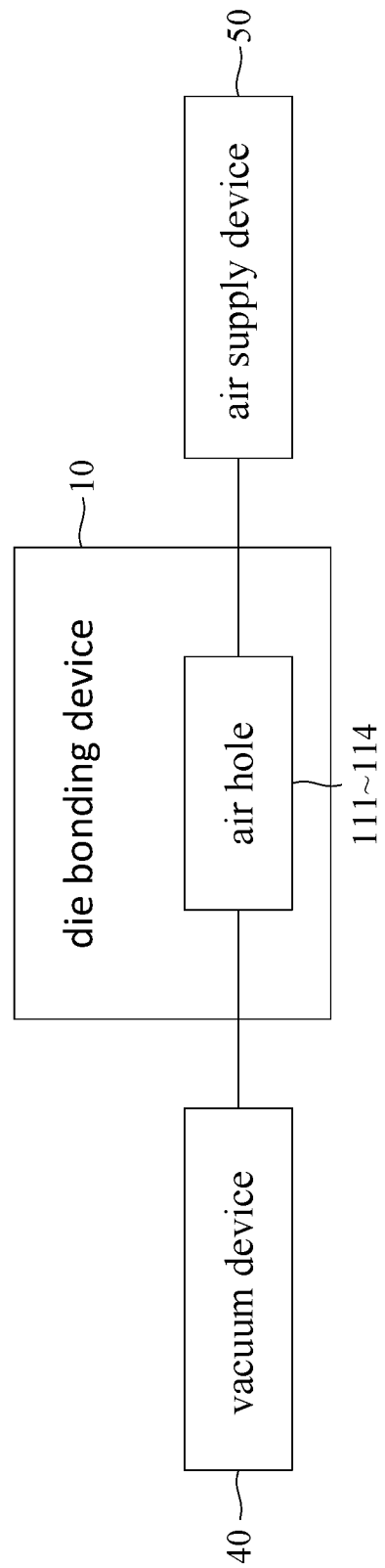
FIG. 2 is a schematic view of the die bonding device, the vacuum device and the air supply device according to an embodiment of the present invention.
Figure 3:
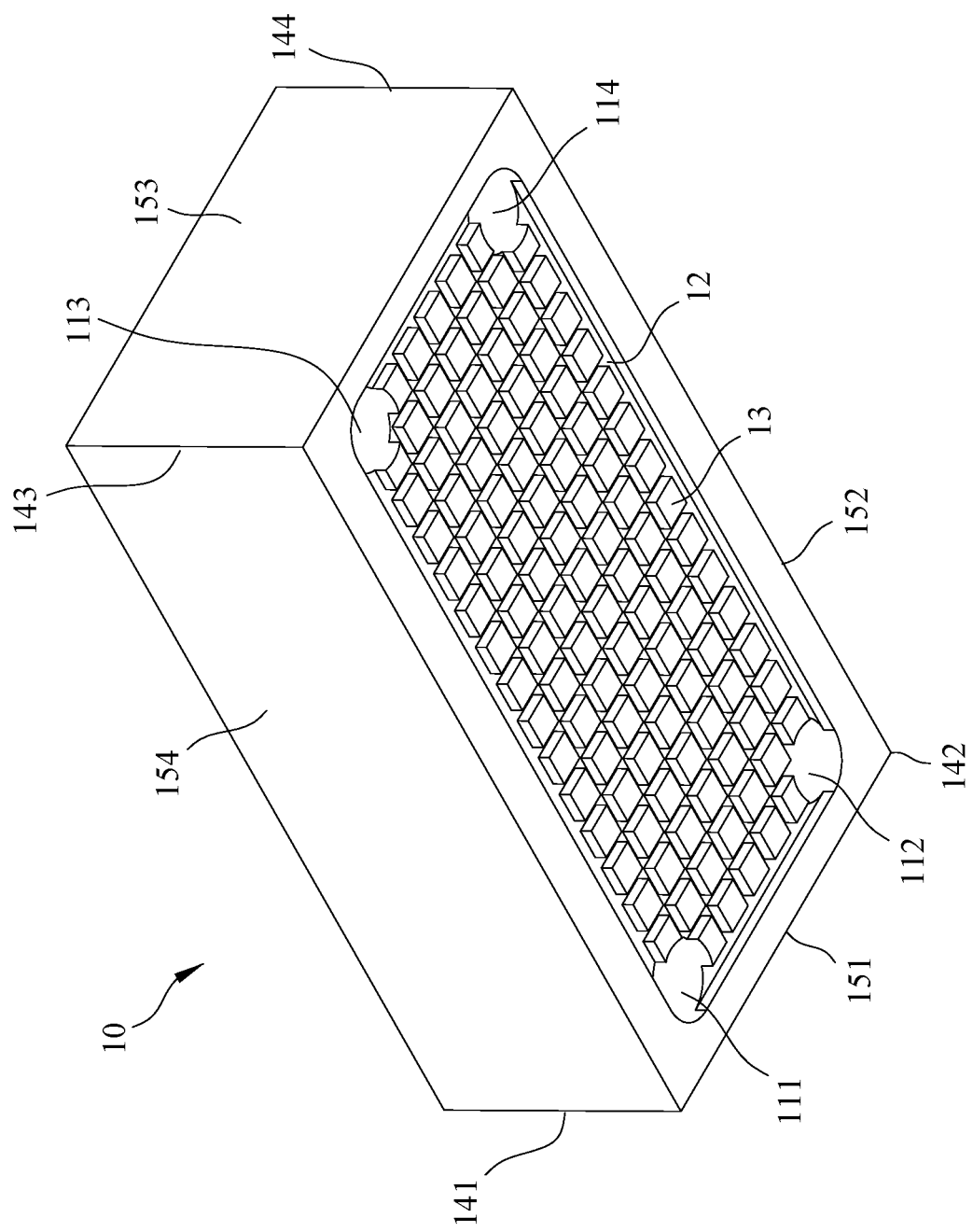
FIG. 3 is a perspective view of the first embodiment of the die bonding device according to the present invention.

As shown in FIGS. 2 and 3, in the first embodiment, the die bonding device 10 has four air holes 111-114, and the air holes 111-114 respectively penetrate the four corners 141-144 of the bottom surface of the die bonding device 10 and connect to a vacuum device 40 and a air supply device 50. A recess 12 and a plurality of protruding bumps 13 are formed on the bottom surface of the die bonding device 10. The area of the recess 12 is smaller than the area of the die 20. The bumps 13 are located in the recess 12. The bottom surface of the die bonding device 10 is on the same plane with the bumps 13, and the air holes 111-114 communicate with the recess 12.

Figure 4:
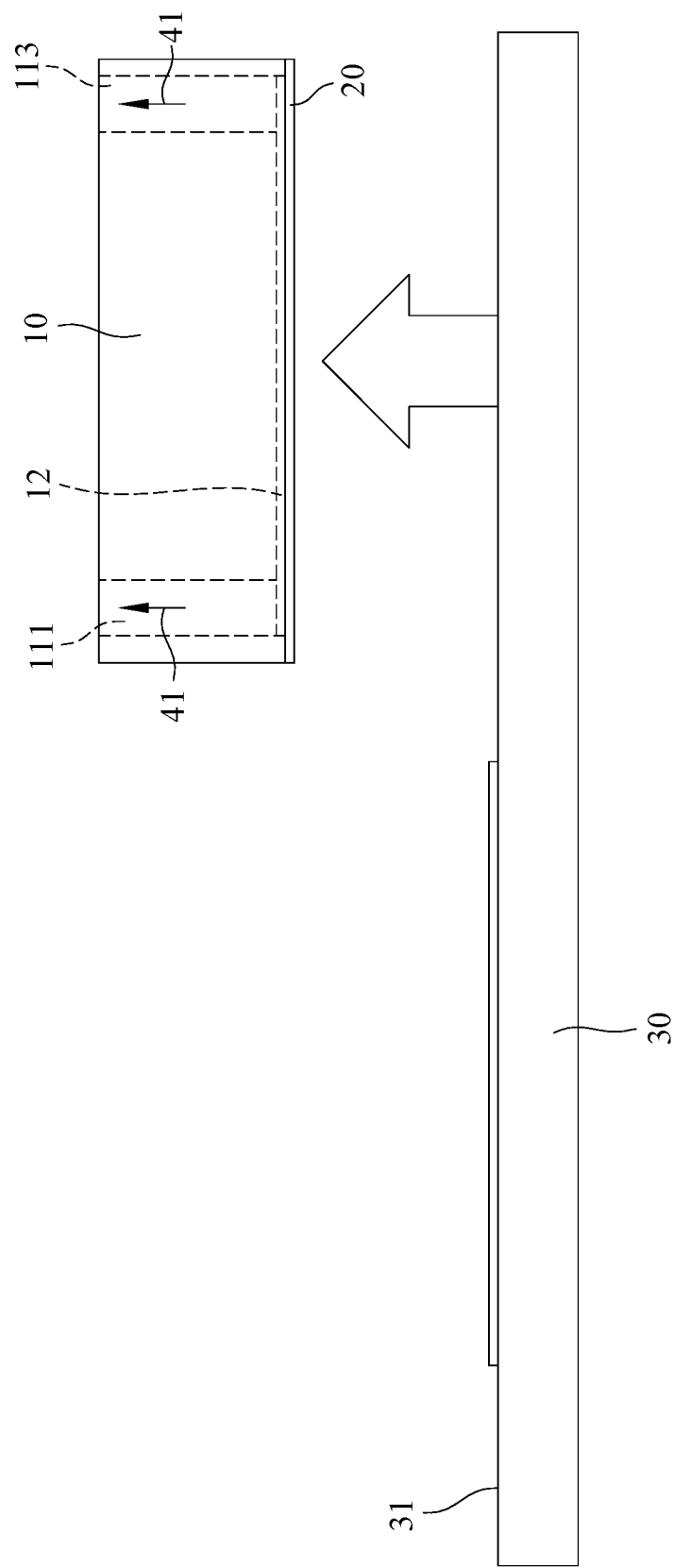
FIG. 4 is a schematic view of the first embodiment of step S1 of the present invention.

As shown in FIG. 4, in the first embodiment, the vacuum device 40 evacuates through the air holes 111-114 and further evacuates the recess 12 through the air holes 111-114 to generate a vacuum and provide the negative pressure 41. The negative pressure 41 adsorbs the four corners 211-214 of the die 20 through the air holes 111-114 and the recess 12, so that the periphery of the die 20 is closely attached to the periphery of the bottom surface of the die bonding device 10, and the inner side of the die 20 is closely attached to the bottom surface of the bumps 13. Because the periphery of the die 20 can be closely attached to the periphery of the bottom surface of the die bonding device 10, there is no gap between the periphery of the die 20 and the bottom surface of the die bonding device 10 at all, which avoids the intrusion of external air and affecting the effect of the negative pressure 41 on adsorbing the die 20. The bumps 13 can keep the die 20 flat and leveled, and prevent the die 20 from being affected by the negative pressure 41 to sink into the recess 12.

Figure 5:
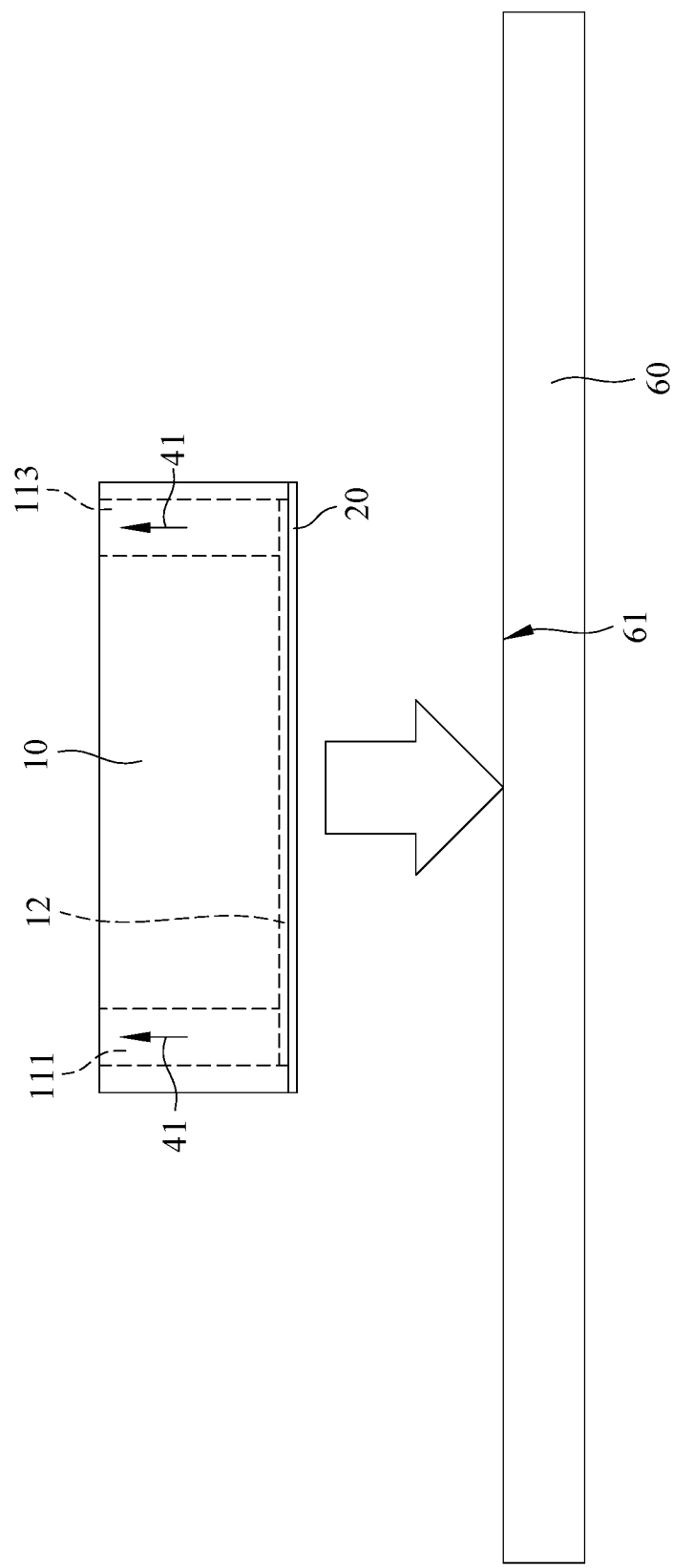
FIG. 5 and FIG. 6 are schematic views of the first embodiment of step S2 of the present invention.
Figure 6:
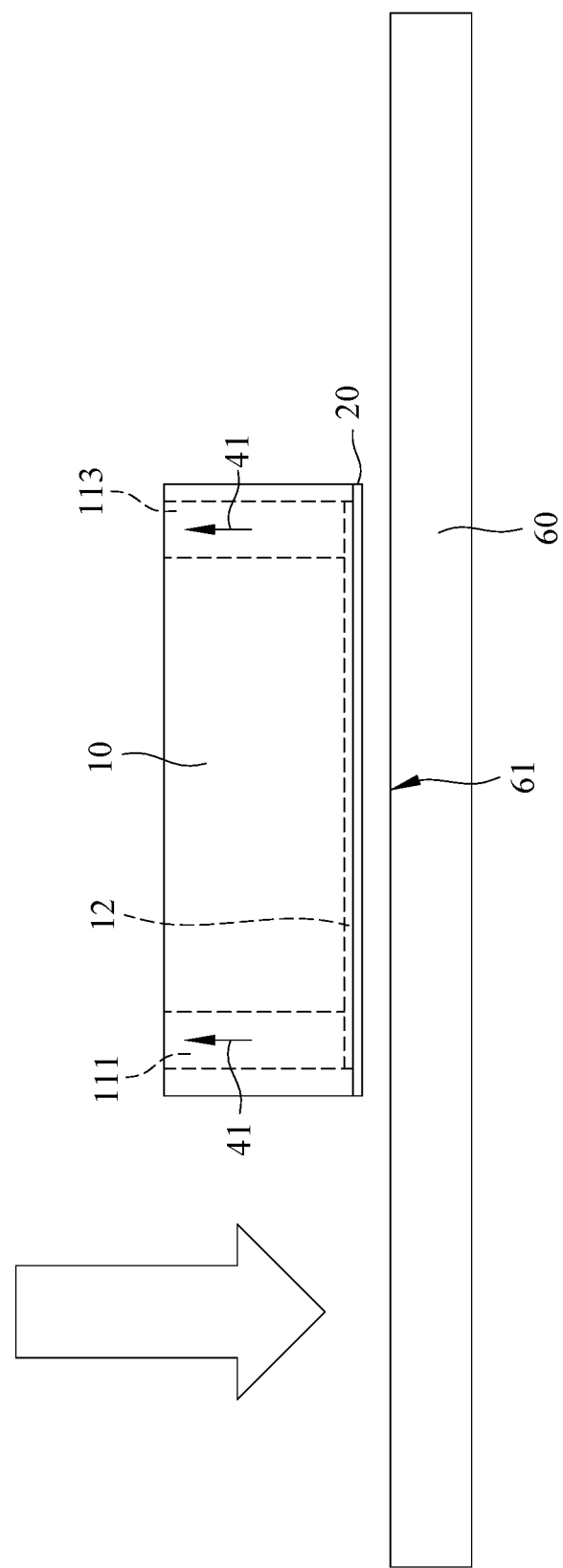

Step S2, as shown in FIGS. 1, 5, and 6, the die bonding device 10 moves the die 20 to one side of a die placement area 61 of a substrate 60, and the surface of the substrate 60 is free of solder and bumps. More specifically, the corner 141 or the side 151 and the rest of the die bonding device 10 continuously adsorb the corner 211 or the side 221 and the rest of the die 20 by the negative pressure 41 to bond the die 20 and prevent the die 20 from separating from the die bonding device 10.

Preferably, as shown in FIGS. 5 and 6, in the first embodiment, the die bonding device 10 moves from the side of the carrier device 30 to the side of the substrate 60 and is located at a first position. The die bonding device 10 moves from the first position to the substrate 60 and stays in a second position. When the die bonding device 10 is in the second position, a distance between the die 20 and the substrate 60 can provide the die 20 to generate a bonding wave (see FIG. 9) after contacting the substrate 60.

Figure 7:
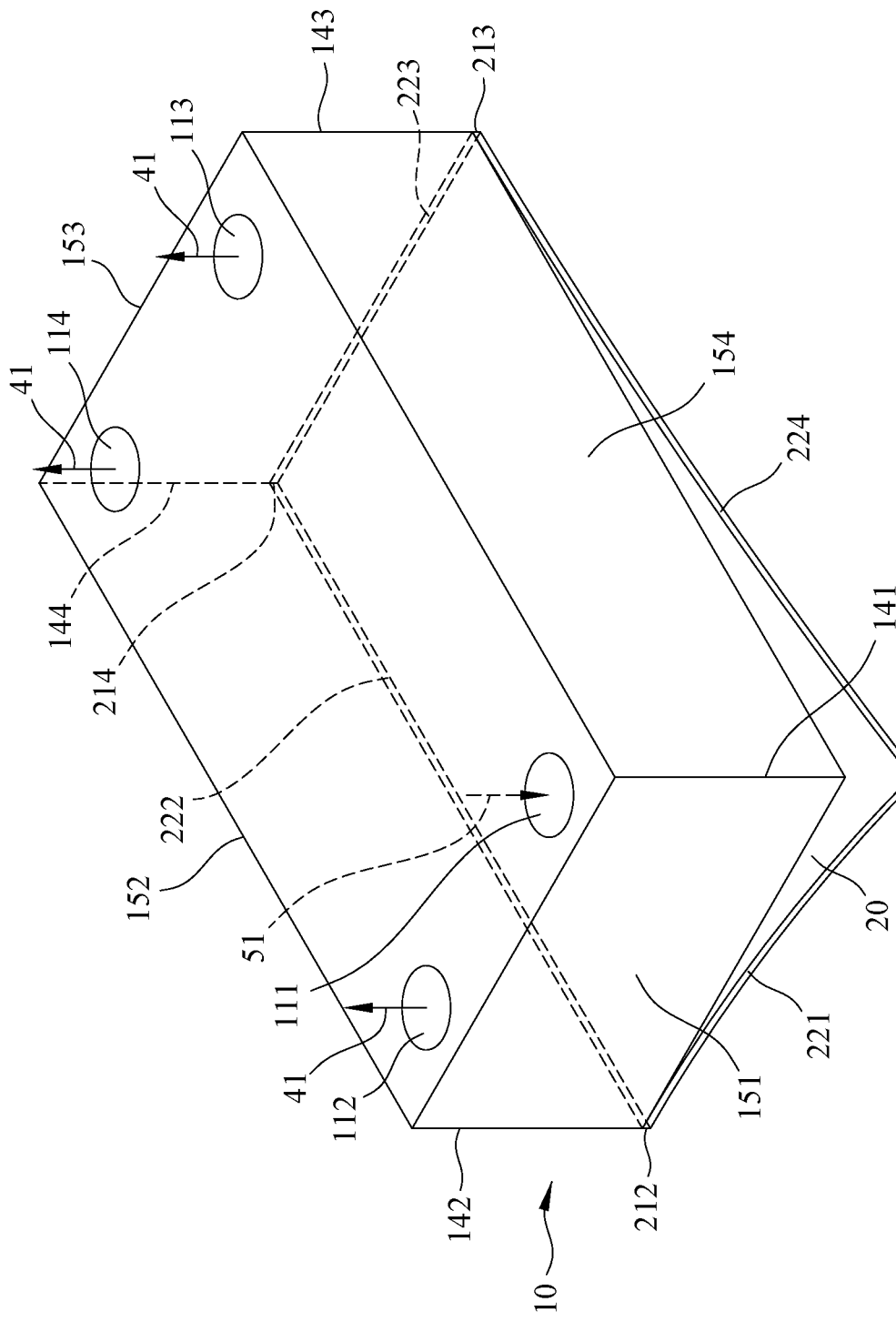
FIG. 7 is a schematic view of the first implementation of the first embodiment of step S3 of the present invention.
Figure 8:
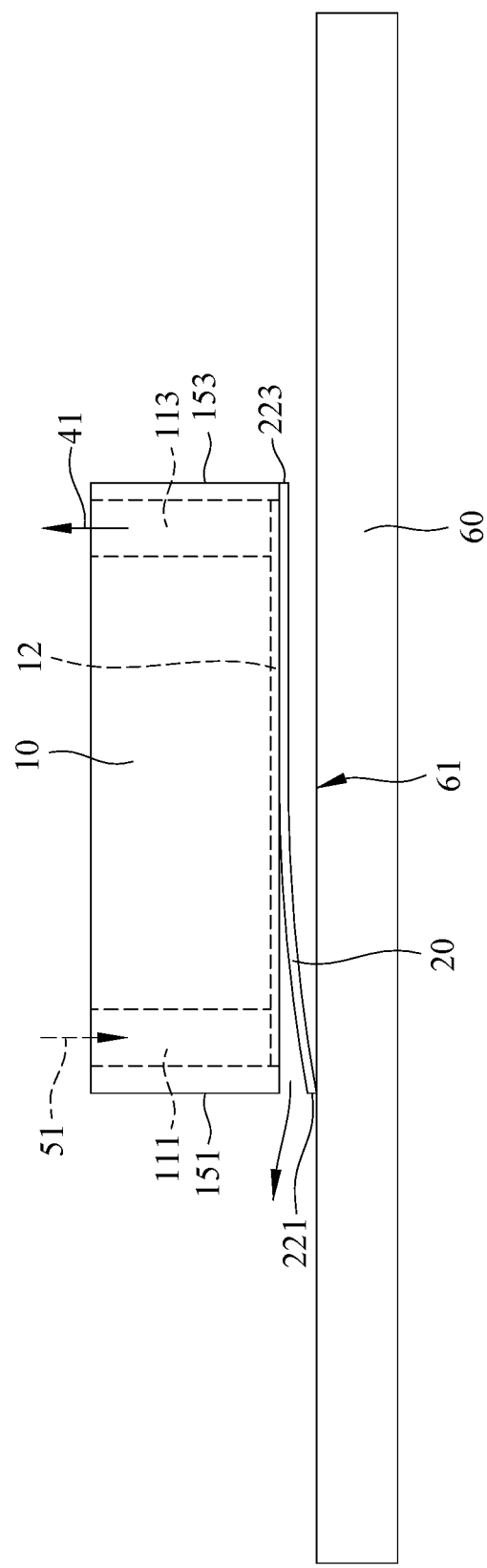
FIG. 8 is a schematic view of the second implementation of the first embodiment of step S3 of the present invention.

Step S3, as shown in FIGS. 1, 7 and 8, the die bonding device 10 uses a positive pressure 51 to blow on the corners 211 or sides 221 of the die 20 so that the corners 211 or sides 221 of the die 20 flexes and deforms to contact the die placement area 61. More specifically, the corner 141 or the side 151 of the die bonding device 10 is switched from using the negative pressure 41 to adsorb the corner 211 or the side 221 of the die 20 to using the positive pressure 51 to blow on the corner 211 or the side 221 of the die 20. The other corners 142-144 or the other sides 222-224 of the die bonding device 10 still maintain by the negative pressure 41 to adsorb the other corners 212-214 or the other sides 222-224 of the die 20. Therefore, the die 20 can not only remain bonded to the die bonding device 10, but also ensure that only the corner 211 or side 221 of the die 20 flexes and deforms, and are most prominent, so that the corner 211 of the die 20 can be in point contact, or the side 221 of the die 20 can be in line contact with the die placement area 61.

As shown in FIGS. 2 and 7, in the first implementation of the first embodiment, the vacuum device 40 stops sucking air from the air holes 111 in the corner 141 of the die bonding device 10, and the negative pressure 41 stops adsorbing the corner 211 of the die 20 through the air hole 111 of the corner 141 of the die bonding device 10, and the air supply device 50 starts to blow air into the air hole 111 of the corner 141 of the die bonding device 10 to generate air flow and provide the positive pressure 51. The positive pressure 51 begins to blow the corner 211 of the die 20 through the air hole 111 in the corner 141 of the die bonding device 10. Therefore, the corner 141 of the die bonding device 10 is switched from using the negative pressure 41 to adsorb the corner 211 of the die 20 to using the positive pressure 51 to blow on the corner 211 of the die 20, and the corner 211 of the die 20 flexes and deforms to be in contact with the die placement area 61. The vacuum device 40 continues to suck air to the remaining air holes 112-114 of the die bonding device 10, so that the remaining air holes 112-114 in the other corners 142-144 of the die bonding device 10 still maintain the suction of the other corners 212-214 and the rest of the die 20 by the negative pressure 41.

As shown in FIGS. 2 and 8, in the second implementation of the first embodiment, the vacuum device 40 stops sucking air from the two air holes 111 and 112 of the side 151 of the die bonding device 10, and the negative pressure 41 stops to adsorb the side 221 of the die 20 through the two air holes 111, 112 of the side 151 of the die bonding device 10, and the air supply device 50 starts blowing air into the two air holes 111, 112 of the side 151 of the die bonding device 10 to generate air flow to provide a positive pressure 51, and the positive pressure 51 starts to blow on the side 221 of the die 20 through the two air holes 111 and 112 of the side 151 of the die bonding device 10. Therefore, the side 151 of the die bonding device 10 is switched from using the negative pressure 41 to adsorb the side 221 of the die 20 to using the positive pressure 51 to blow on the side 221 of the die 20, and the side 221 of the die 20 flexes and deforms to be in contact with the die placement area 61. The vacuum device 40 continues to suck air through the remaining air holes 113, 114 on the other sides 152-154 of the die bonding device 10, so that the remaining air holes 113, 114 on the other sides 152-154 of the die bonding device 10 are still maintained by the negative pressure 41 to adsorb the other sides 222-224 and the rest of the die 20.

Figure 9:
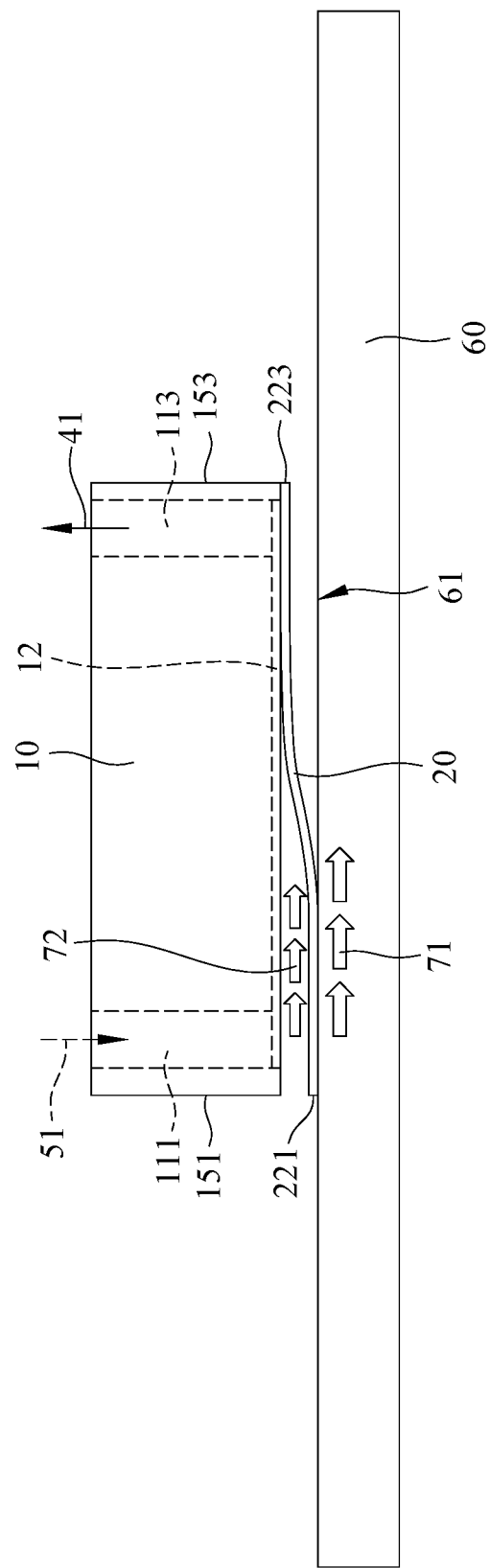
FIG. 9 is a schematic view of the first embodiment of step S4 of the present invention.

Step S4, as shown in FIGS. 1 and 9, the corner 211 or side 221 of the die 20 forms a bonding wave 71 after contacting the die placement area 61, and the bonding wave 71 starts from the corner 211 of the die 20 to expand diagonally or expand from the side 221 of the die 20 to the opposite side thereof, so that the die 20 gradually separates from the die bonding device 10 and is bonded on the die placement area 61. More specifically, because the corner 211 of the die 20 is in point contact or the side 221 of the die 20 is in line contact with the die placement area 61, the corner 211 or side 221 of the die 20 and adjacent area will generate a bond force, and this bond force will further form a bonding wave 71 and gradually expand to the diagonal corner of the corner 211 of the die 20 or the opposite side of the side 221 of the die 20.

Preferably, the die bonding device 10 performs the switching from using the negative pressure 41 to adsorb the corner 211 of the die 20 to using the positive pressure 51 to blow on the corner 211 of the die 20 gradually to the diagonal corners, or the switching from using the negative pressure 41 to adsorb the side 221 of the die 20 to using the positive pressure 51 to blow on the side 221 of the die 20 gradually to the opposite sides, so that the corner 211 of the die 20 will gradually be blown on by the positive pressure 51 from the corner 211 or the side 221 in sequence. As such, a pressure difference fluctuation 72 is generated. The pressure difference fluctuation 72 can further facilitate the corner 211 or the side 221 of the die 20 to form a bonding wave 71 after contacting the die placement area 61, and guide the bonding wave 71 from the corner 211 of the die 20 to expand to the diagonal corner or from the side 221 of the die 20 to the opposite side thereof. Thus, the die 20 is gradually separated from the die bonding device 10 and bonded on the die placement area 61.

In the first implementation of the first embodiment, starting at the corner 141 of the die bonding device 10, the vacuum device 40 sequentially stops sucking air from the remaining air holes 112-114 of the die bonding device 10, and the negative pressure 41 stops adsorbing the remaining corners of the die through the air hole 112-114 sequentially. The air supply device 50 sequentially starts to blow air on the corner 141 of the die bonding device 10 then to the remaining air holes 112-114 to generate airflow and provide the positive pressure 51. The positive pressure 51 starts to pass through the remaining air holes 112-114 to blow on the remaining corners of the die 20. Therefore, a pressure difference fluctuation 72 is generated because the corner 141 of the die bonding device 10 switches from using the negative pressure 41 to adsorb the corner 211 of the die 20 using the positive pressure 51 to blow on the corner 211 of the die 20 and proceeds sequentially towards the diagonal part. The pressure difference fluctuation 72 can further facilitate the corner 211 of the die 20 to form a bonding wave 71 after contacting the die placement area 61, and guide the bonding wave 71 to expand from the corner 211 of the die 20 towards the diagonal corner, so that the die 20 is gradually separated from the die bonding device 10 and bonded on the die placement area 61.

In the second implementation of the first embodiment, starting at the side 151 of the die bonding device 10, the vacuum device 40 sequentially stops sucking air from the remaining air holes 112-114 of the die bonding device 10, and the negative pressure 41 stops adsorbing the remaining sides of the die through the air hole 112-114 sequentially. The air supply device 50 sequentially starts to blow air on the side 151 of the die bonding device 10 then to the remaining air holes 112-114 to generate airflow and provide the positive pressure 51. The positive pressure 51 starts to pass through the remaining air holes 112-114 to blow on the remaining sides of the die 20. Therefore, a pressure difference fluctuation 72 is generated because the side 151 of the die bonding device 10 switches from using the negative pressure 41 to adsorb the side 221 of the die 20 using the positive pressure 51 to blow on the side 221 of the die 20 and proceeds sequentially towards the opposite side. The pressure difference fluctuation 72 can further facilitate the side 221 of the die 20 to form a bonding wave 71 after contacting the die placement area 61, and guide the bonding wave 71 to expand from the side 221 of the die 20 towards the opposite side, so that the die 20 is gradually separated from the die bonding device 10 and bonded on the die placement area 61.

Figure 10:
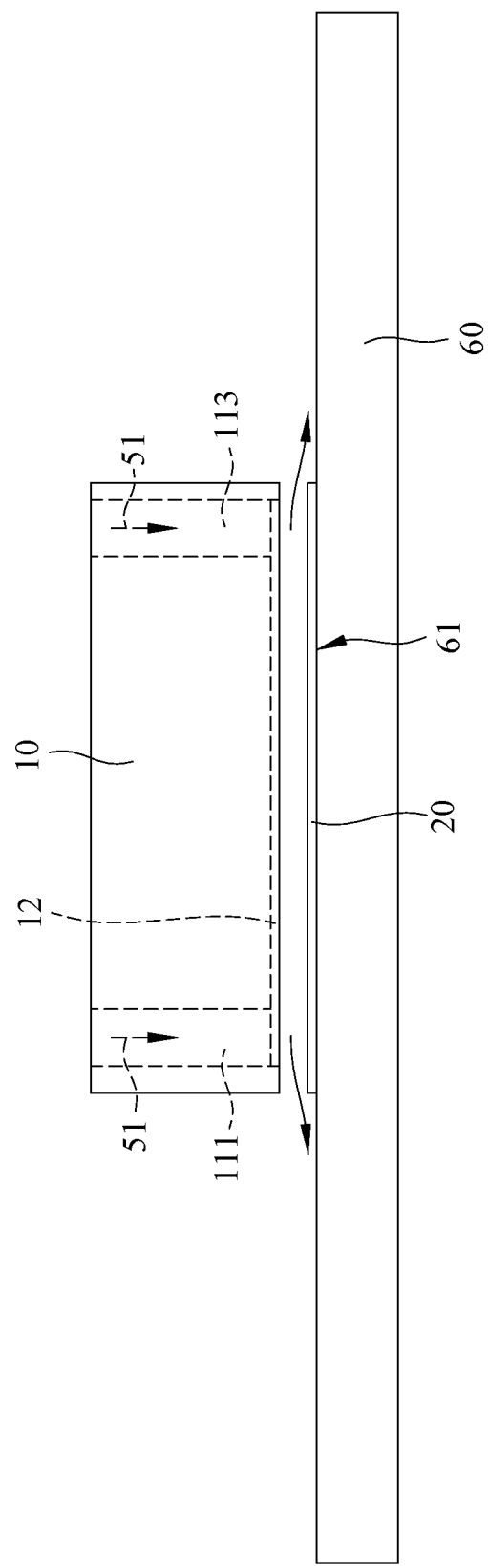
FIG. 10 is a schematic view of the first embodiment of step S5 of the present invention.

Step S5, as shown in FIGS. 1 and 10, the die 20 is completely bonded on the die placement area 61. Specifically, the negative pressure 41 is completely stopped, the die bonding device 10 no longer fixes the die 20, and the positive pressure 51 continues to blow, and the die 20 is completely bonded on the die placement area 61.

Figure 11:
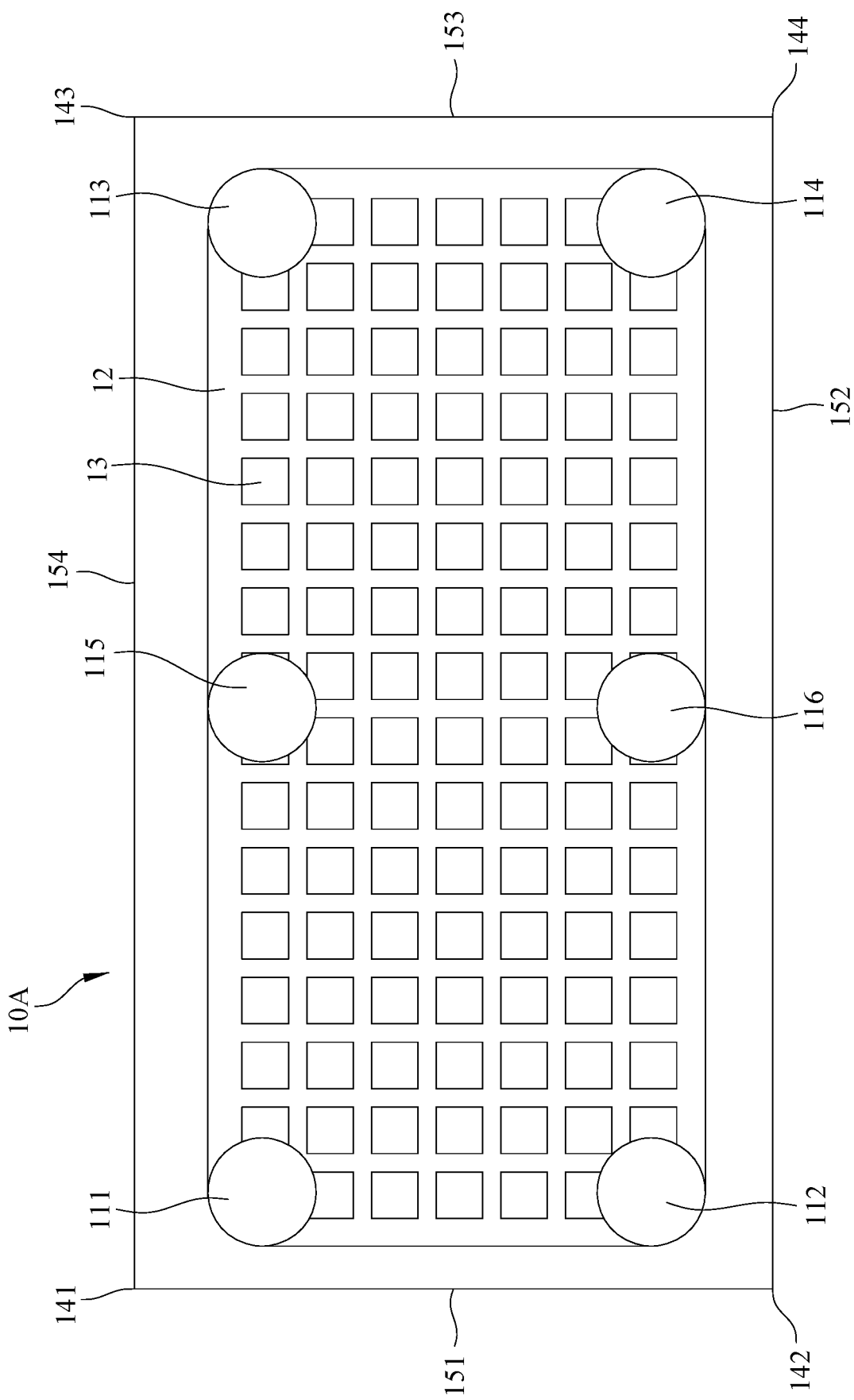
FIG. 11 is a top view of the second embodiment of the die bonding device according to the present invention.
Figure 12:
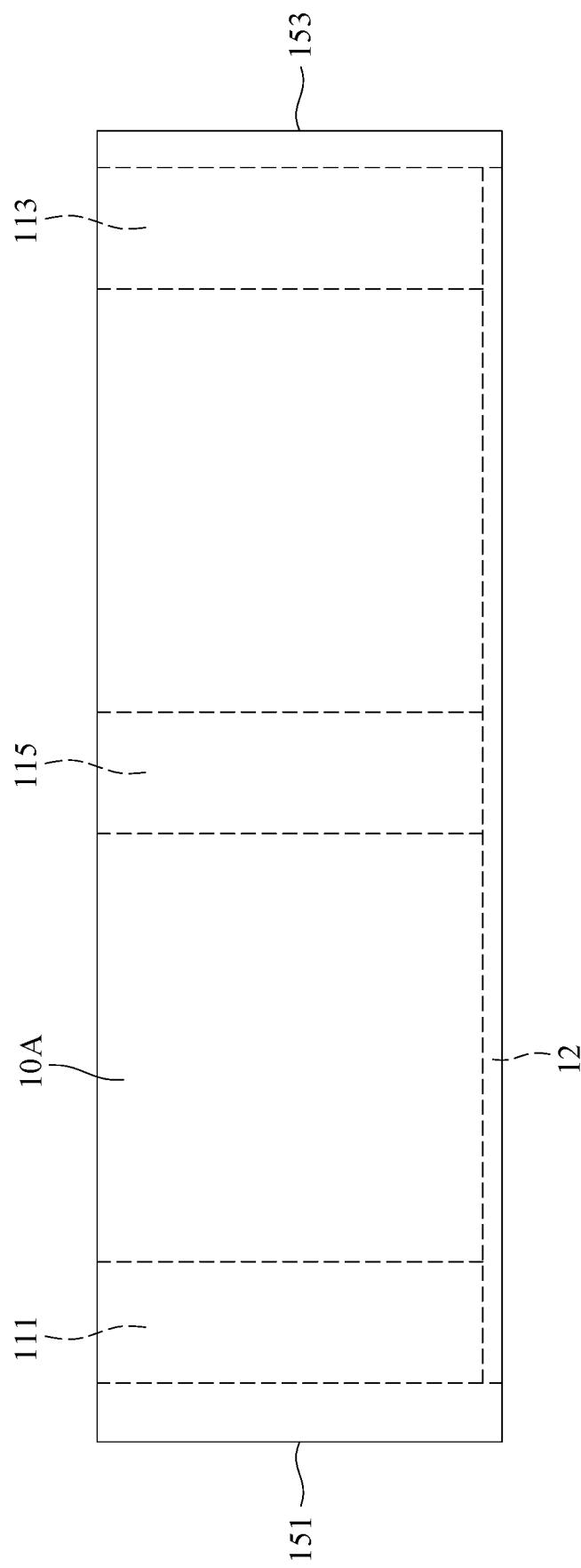
FIG. 12 is a side view of the second embodiment of the die bonding device according to the present invention.

Referring to FIGS. 11 and 12, the difference between the second embodiment and the first embodiment is that the die bonding device 10A has six air holes 111-116, and the air holes 111-114 respectively penetrate the four corners 141-144 of the bottom surface of the die bonding device 10A, the air holes 115, 116 respectively penetrate through the two opposite sides 152, 154 of the bottom surface of the die bonding device 10A and are respectively located between the two pairs of the corners 141-144. Otherwise, the remaining technical features of the second embodiment are the same as those of the first embodiment.

Figure 13:
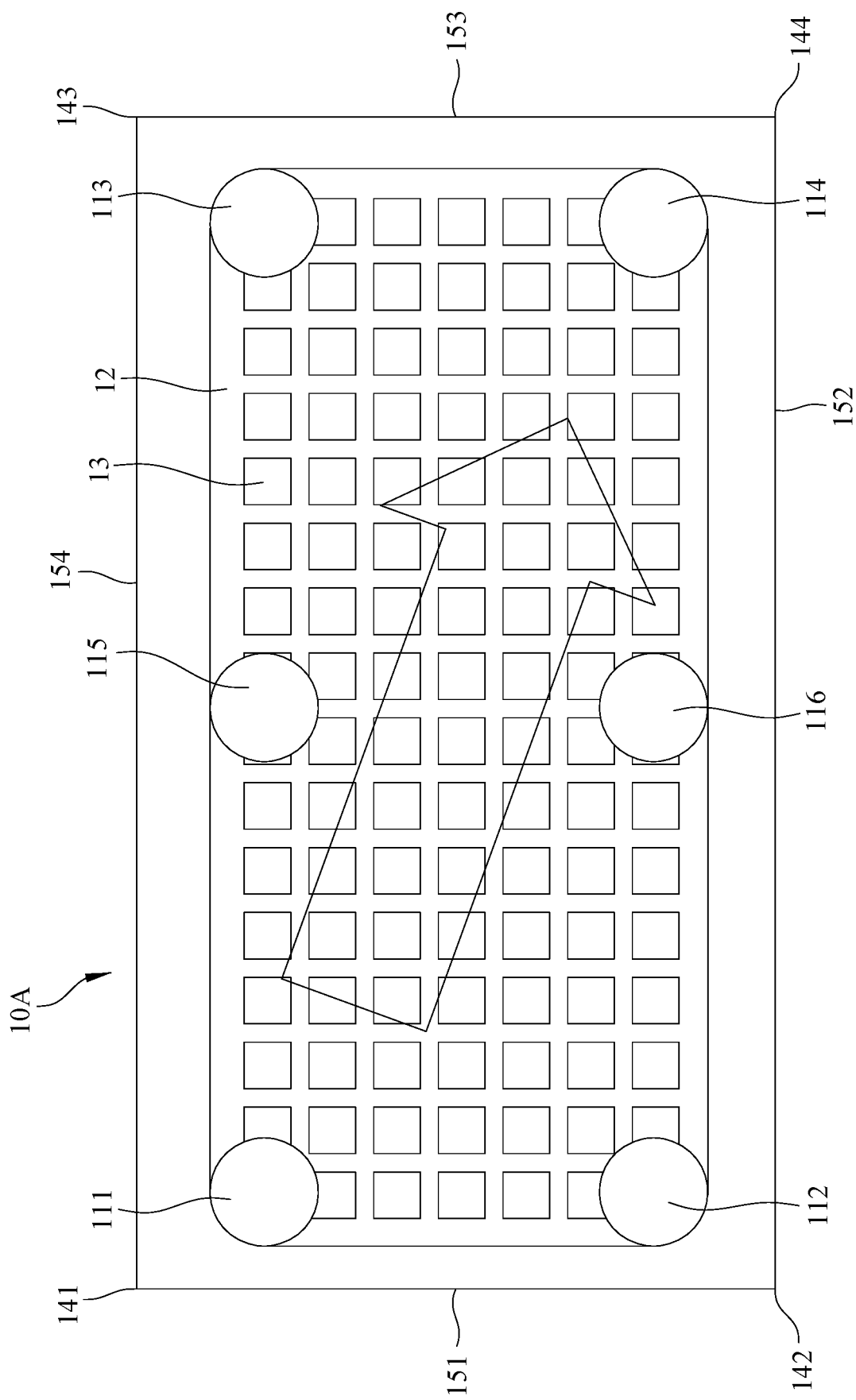
FIG. 13 is a schematic view of the first implementation of the second embodiment of step S3 of the present invention.
Figure 14:
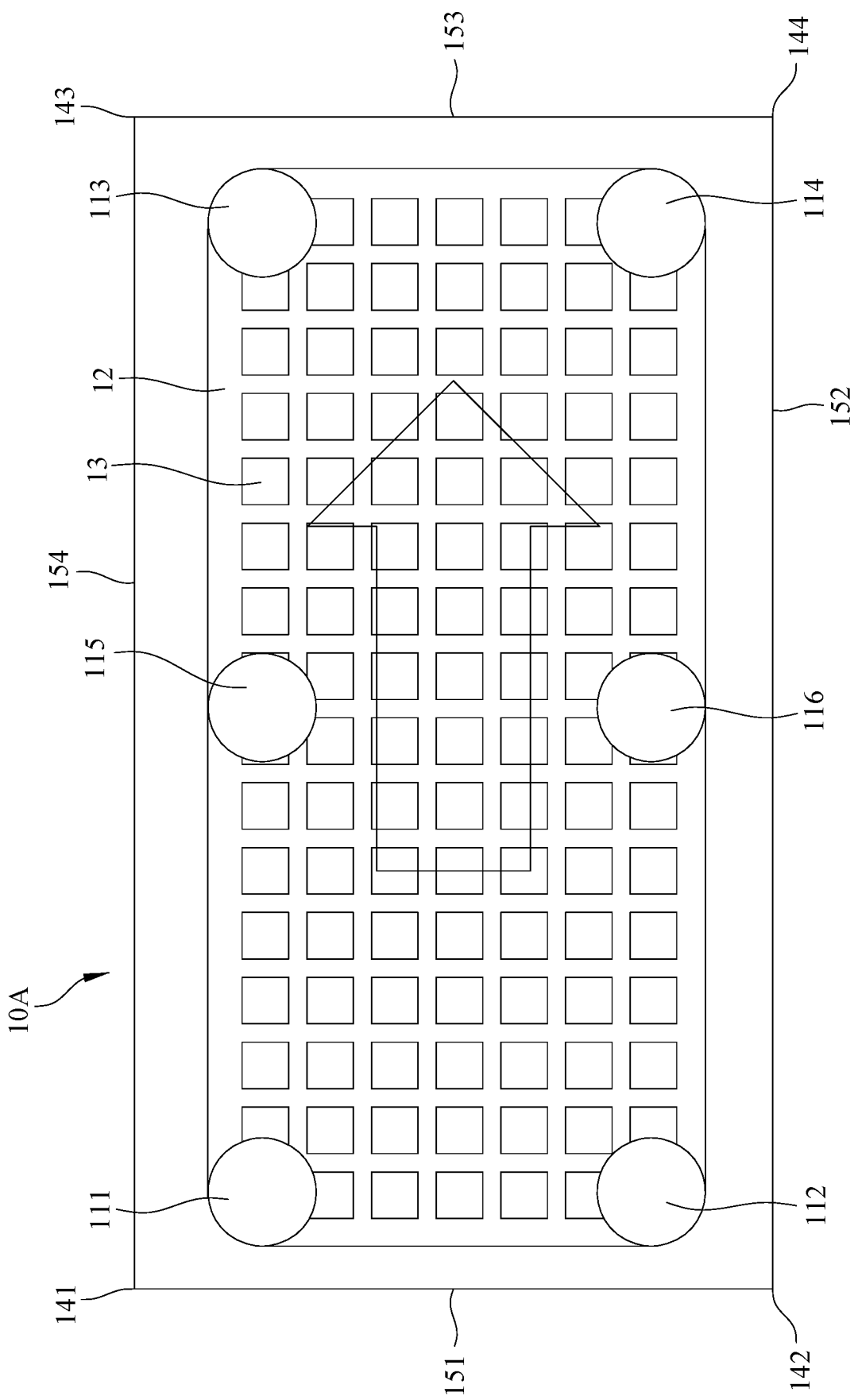
FIG. 14 is a schematic view of the second implementation of the second embodiment of step S3 of the present invention.

Refer to FIG. 13 and FIG. 14. Regarding step S3, the two implementations of the second embodiment are completely the same as the first embodiment.

Figure 15:
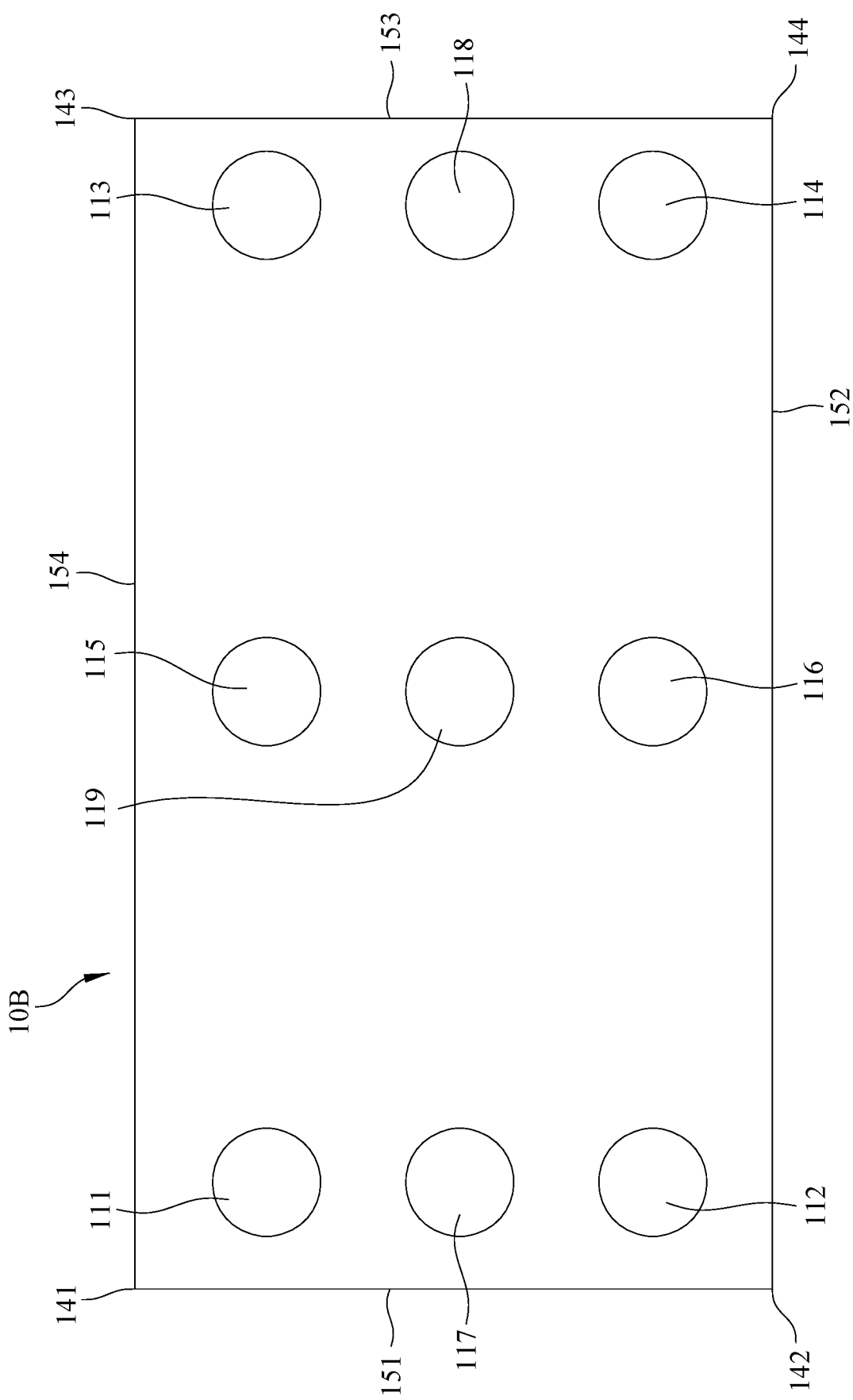
FIG. 15 is a top view of the third embodiment of the die bonding device according to the present invention.
Figure 16:
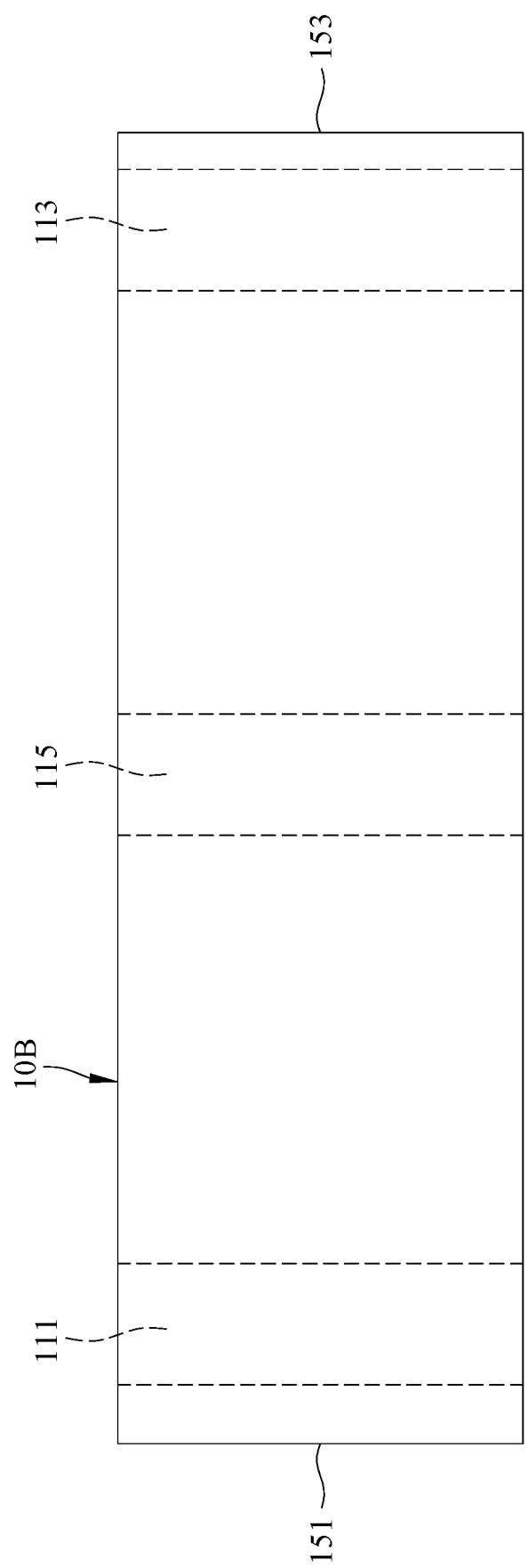
FIG. 16 is a side view of the third embodiment of the die bonding device according to of the present invention.

Referring to FIGS. 15 and 16, the difference between the third embodiment and the first embodiment is: first, the die bonding device 10B has nine air holes 111-119, and the air holes 111-114 respectively penetrate the four corners 141-144 of the bottom surface of the die bonding device 10B, the air holes 115-118 respectively penetrate through the four sides 151-154 of the bottom surface of the die bonding device 10B and are located between each pair of the corners 141-144, and the air hole 119 is located at the center of the bottom surface; second, the bottom surface of the die bonding device 10B does not have recesses 12 and bumps 13. The remaining technical features of the third embodiment are completely the same as those of the first embodiment.

Figure 17:
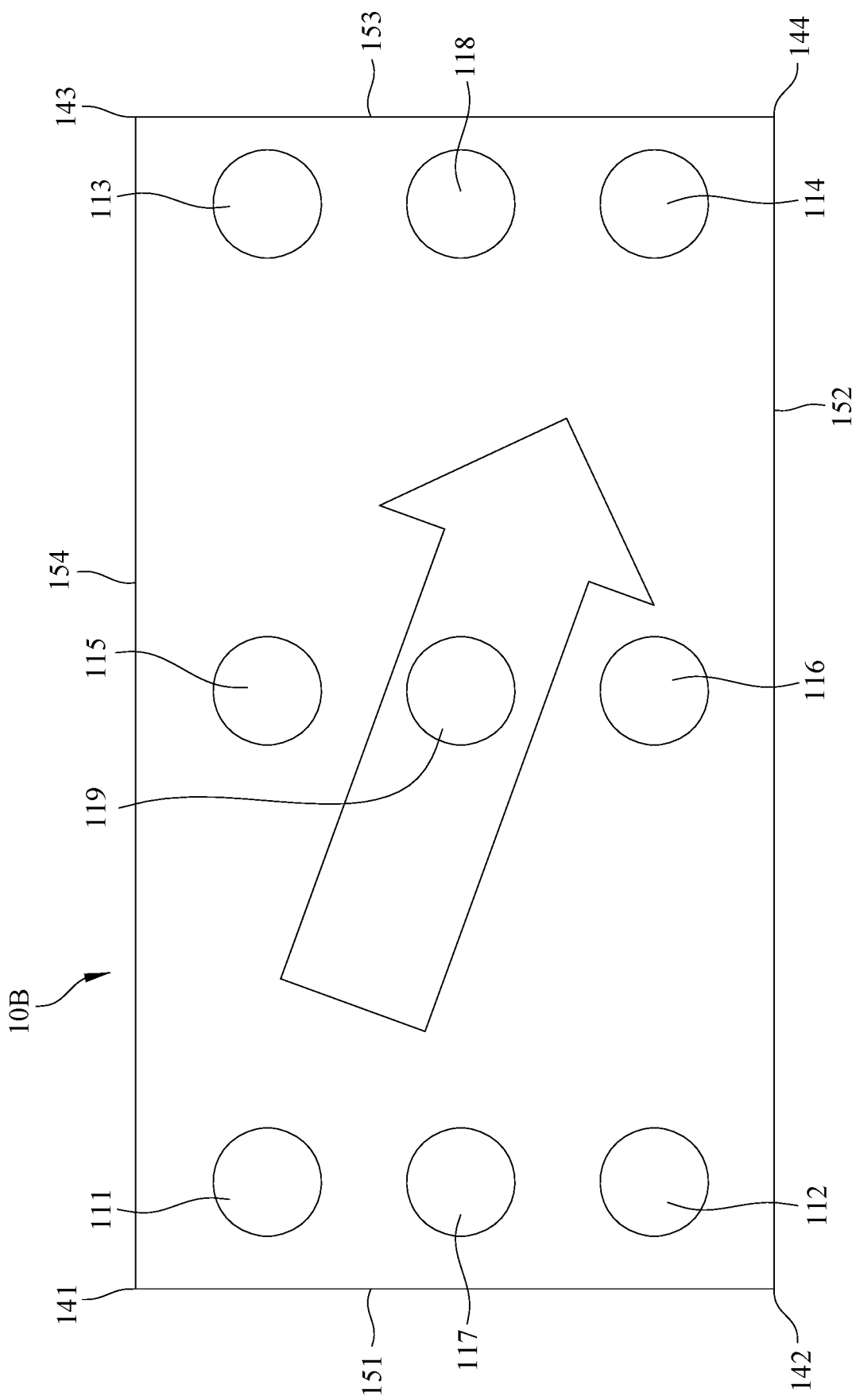
FIG. 17 is a schematic view of the first implementation of the third embodiment of step S3 of the present invention.
Figure 18:
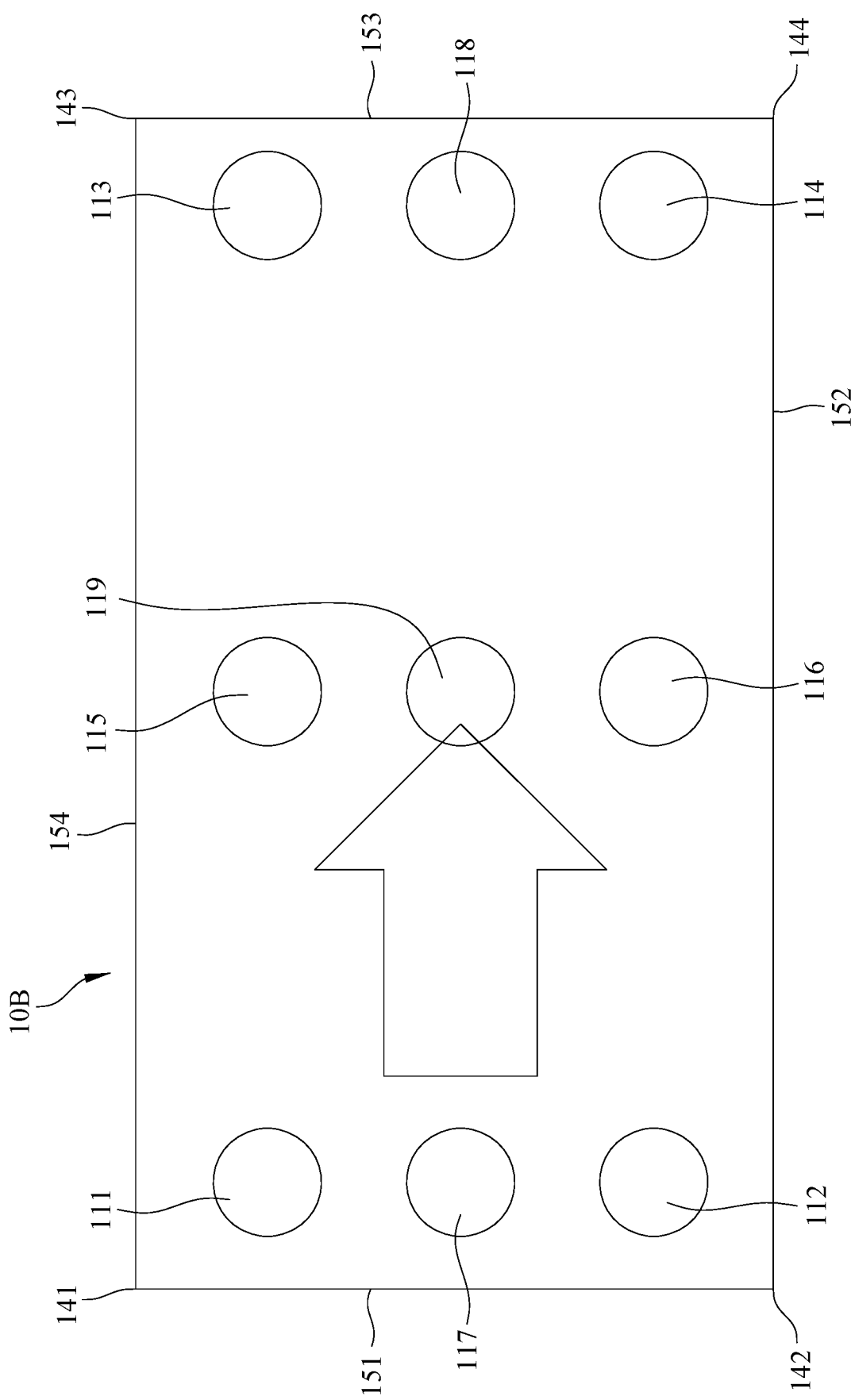
FIG. 18 is a schematic view of the second implementation of the third embodiment of step S3 of the present invention.

Refer to FIG. 17 and FIG. 18. Regarding step S3, the two implementations of the third embodiment are completely the same as the first embodiment.

Figure 19:
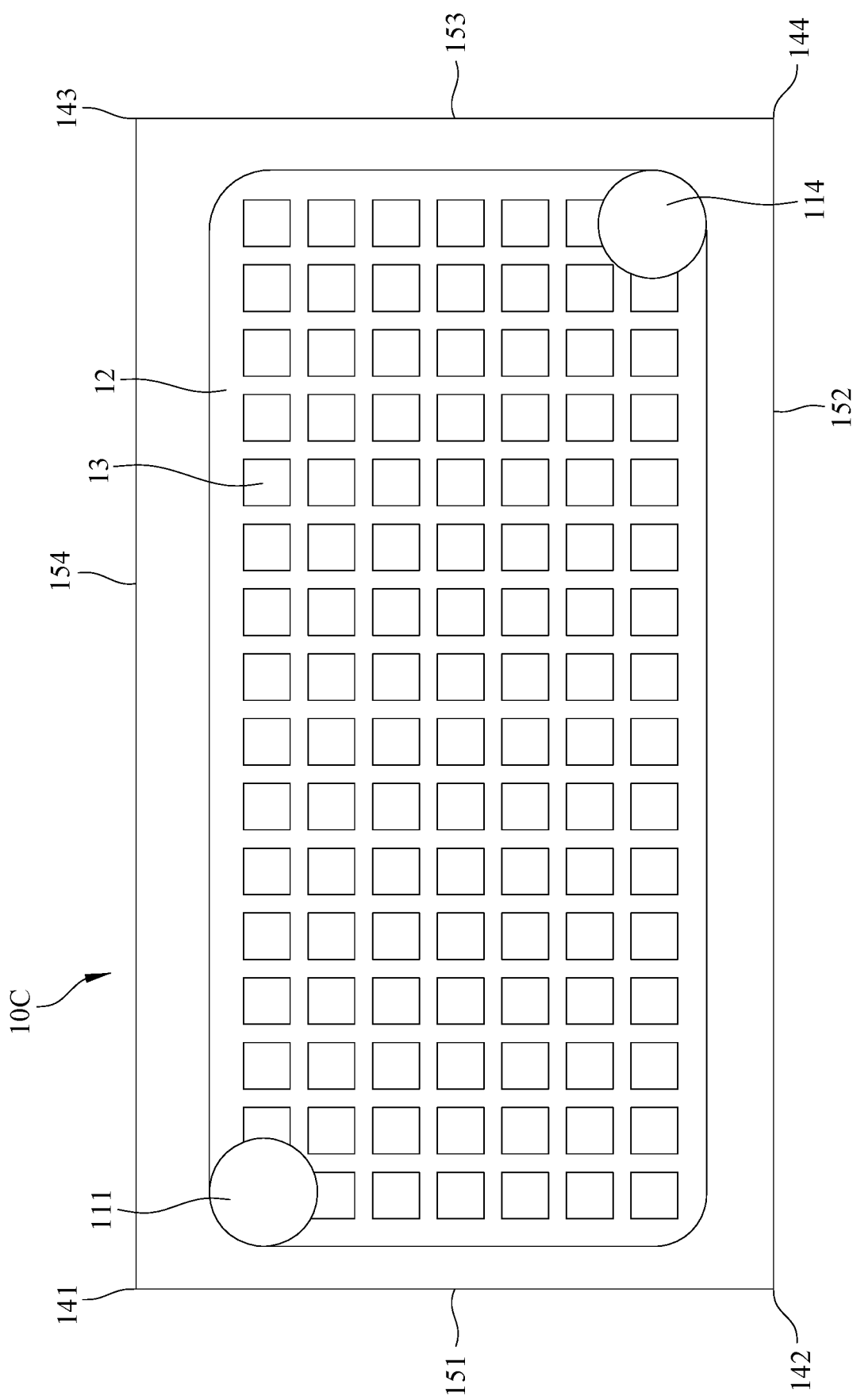
FIG. 19 is a top view of the fourth embodiment of the die bonding device according to the present invention.
Figure 20:
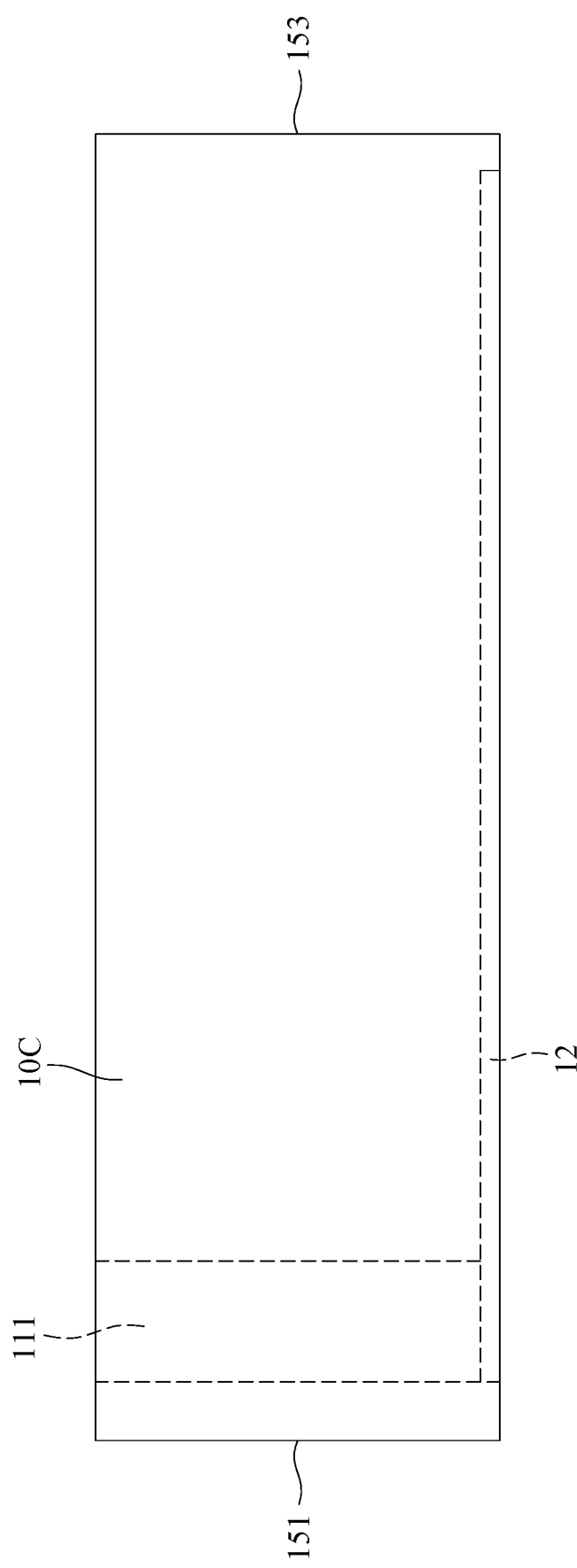
FIG. 20 is a side view of the fourth embodiment of the die bonding device according to the present invention.

Referring to FIGS. 19 and 20, the difference between the fourth embodiment and the first embodiment is that the die bonding device 10C has two air holes 111 and 114, and the two air holes 111 and 114 respectively penetrate two opposite corners 141, 144 of the bottom surface of the die bonding device 10C. Otherwise, the remaining technical features of the fourth embodiment are the same as those of the first embodiment.

Figure 21:
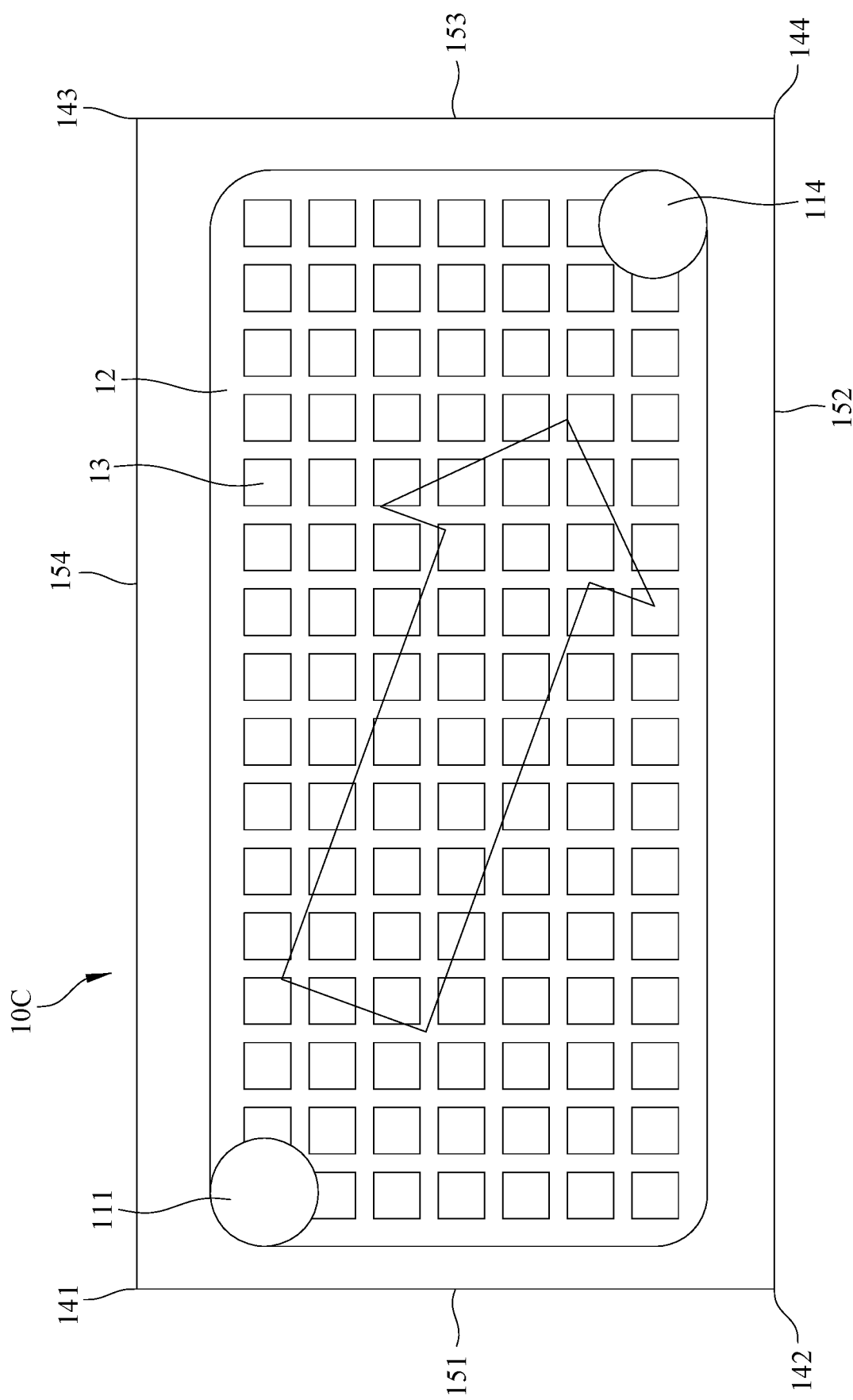
FIG. 21 is a schematic view of the implementation of the fourth embodiment of step S3 of the present invention.

Refer to FIG. 21. Regarding step S3, the implementation of the fourth embodiment is the same as the first implementation of the first embodiment. The fourth embodiment does not have the second implementation as the first embodiment.

Figure 22:
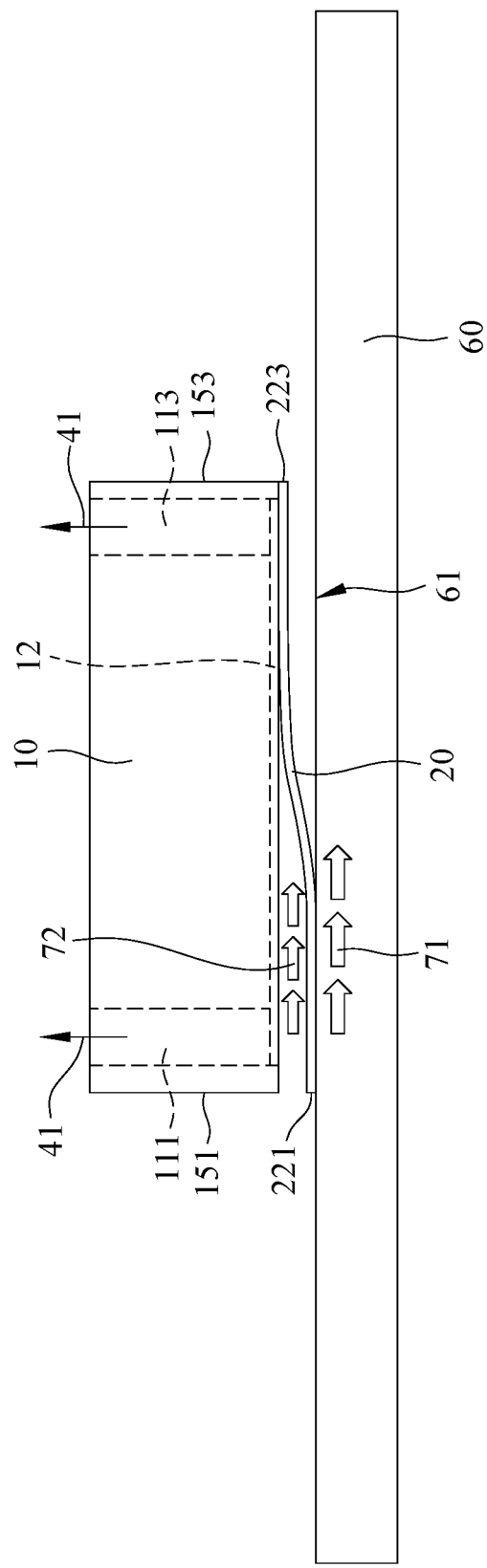
FIG. 22 is a schematic view of the fifth embodiment of step S4 of the present invention.
Figure 23:
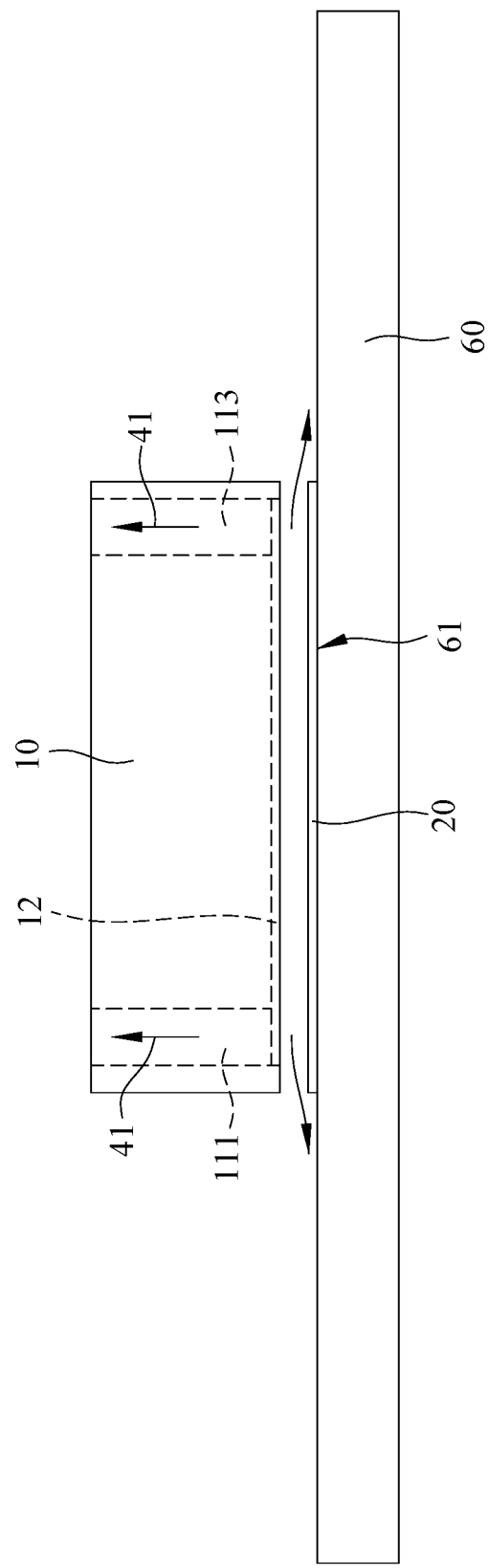
FIG. 23 is a schematic view of the fifth embodiment of step S5 of the present invention.

Referring to FIGS. 22 and 23, the difference between the fifth embodiment and the first embodiment is: in step S4, the bonding wave 71 expands from the corner 211 of the die 20 to the diagonal corner or from the side 221 of the die 20 to the opposite side, and then the positive pressure 51 blowing on the corner 141 or the side 221 of the die bonding device 10 is gradually weakened and further switched to a negative pressure 41, so that the die 20 is gradually separated from the die bonding device 10 and bonded on the die placement area 61.

In summary, the present invention can control the corner 211 or side 221 of the die 20 to contact the die placement area 61 by the non-impact positive pressure 51, and the force of the die 20 in contact with the substrate 60 is limited to the mass of the die 20, which is extremely small, will not damage the die 20, and there is no need to install elastic members, and the manufacturing cost is low.

Furthermore, in the present invention, the die 20 can be completely bonded on the die placement area 61 by the bonding wave 71, so that the die 20 can be accurately placed on the die placement area 61.

In addition, the present invention can provide a pressure difference fluctuation 72 by controlling the switching from the negative pressure 41 to the positive pressure 51, the pressure difference fluctuation 72 forms the bonding wave 71, and the pressure difference fluctuation 72 guides the bonding wave 71 to spread. Thereby, the die 20 can be closely attached to the substrate 60, completely eliminating the situation that the die 20 and the substrate 60 enclose the bubbles, and there will be no voids between the die 20 and the substrate 60, which improves the product yield rate of the die 20 in subsequent processing.

In addition, the present invention can control the die 20 to be attached to the die placement area 61 at an appropriate bonding speed by gradually weakening the positive pressure 51 and further switching to the negative pressure 41 to prevent the die from being damaged, skewed or bent.

It is worth mentioning that because the die bonding method with corner or side contact without impact force of the present invention is developed for hybrid bonding technology, and the hybrid bonding technology is a tin-free bonding method. The present invention selects dies 20 and the substrate 60 without tin balls and no copper bumps to emphasize that the method of the present invention is limited to the hybrid bonding technology.

It should be noted that the surface of the die 20 and the substrate 60 is very important when performing tin-free packaging. The surface of the die and the substrate will be directly connected after the chemical mechanical polishing process. Therefore, the surface of the die 20 and the substrate 60 must be close to the mirror surface. The reason is that a slight change in the surface roughness may cause the joining of the die 20 and the substrate failed. After the chemical mechanical polishing process, due to the different materials, the extent of polishing is also different. Generally, the acceptable error range of the polishing is within ±10 nm, and two defects are likely to occur if the value exceeds 10 nm: (1) copper contacts are over-polished; (2) too much is reserved on copper contacts, and the base of the substrate 60 is over-polished.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A die bonding method with corner or side contact without impact force, comprising the following steps:
    (a) a die bonding device picking up a die, and the die being free of solder and bump on surface;
    (b) the die bonding device moving the die to one side of a die placement area of a substrate, and the substrate being free of solder and bump on surface;
    (c) the die bonding device blowing one corner or one side of the die by a positive pressure, thereby bending the corner or the side of the die to contact the die placement area;
    (d) forming a bond wave after the corner or the side of the die contacting the die placement area, and spreading the bond wave from the corner of the die to opposite corner of the die or from the side of the die to opposite side of the die, so that the die separating from the die bonding device gradually and becoming bonded on the die placement area; and
    (e) the die being bonded on the die placement area completely.

2. The die bonding method with corner or side contact without impact force according to claim 1, wherein in step (a), a corner or a side and the rest of the die bonding device uses a negative pressure to adsorb the corner or the side and the rest of the die, bond the die, and pick up the die;
    in step (b), the corner or the side and the rest of the die bonding device continue using the negative pressure to adsorb the corner or the side and the rest of the die, and bond the die;
    in step (c), the corner or the side of the die bonding device is switched from using the negative pressure adsorbing the corner or the side of the die to using the positive pressure to blow on the corner or the side of the die, while the rest of the die bonding device still maintains the negative pressure to adsorb the rest of the die;
    in the step (d), the corner or the side of the die bonding device switches from using the negative pressure to adsorb the corner or the side of the die to using the positive pressure to blow on the corner or the side of the die and the switching is proceed gradually and sequentially towards the opposite corner or the opposite side of the die, and a pressure difference fluctuation is generated, the pressure difference fluctuation further makes the corner or the side of the die forming a bonding wave after contacting the die placement area, and then the bonding wave is guided to expand diagonally from the corner or the side of the die towards the opposite corner or the opposite side, so that the die is gradually separated from the die bonding device and bonded on the die placement area.

3. The die bonding method with corner or side contact without impact force according to claim 2, wherein the die bonding device has a plurality of air holes, and the air holes are connected to a vacuum device and an air supply device, and the vacuum device evacuates the air holes to generate a vacuum so that the negative pressure is provided, the negative pressure adsorbs the die through the air holes, the air supply device blows into the air holes to generate an air flow and provides the positive pressure, and the positive pressure blows on the die through the air holes.

4. The die bonding method with corner or side contact without impact force according to claim 3, wherein the die bonding device has two air holes, and the air holes respectively penetrate two corners of the bottom surface of the die bonding device, and the two corners are diagonal.

5. The die bonding method with corner or side contact without impact force according to claim 3, wherein the die bonding device has four air holes, and the air holes respectively penetrate four corners of the bottom surface of the die bonding device.

6. The die bonding method with corner or side contact without impact force according to claim 3, wherein the die bonding device has six air holes, four of the air holes respectively penetrate four corners of the bottom surface of the die bonding device, and the other two air holes respectively penetrate through the two opposite sides of the bottom surface of the die bonding device and are respectively located between two adjacent corners.

7. The die bonding method with corner or side contact without impact force according to claim 3, wherein the die bonding device has nine air holes, four of the air holes respectively penetrate four corners of the bottom surface of the die bonding device, and the other four air holes respectively penetrate through the four sides of the bottom surface of the die bonding device and are located between each pair of the adjacent corners, and one of the air holes penetrates the center of the bottom surface of the die bonding device.

8. The die bonding method with corner or side contact without impact force according to claim 3, wherein a recess is formed on the bottom surface of the die bonding device, the area of the recess is smaller than the area of the die, and the air holes communicate with the recess.

9. The die bonding method with corner or side contact without impact force according to claim 3, wherein a recess and a plurality of protruding bumps are formed on the bottom surface of the die bonding device, the protrusions are located in the recess, and the protrusions and the bottom surface of the die bonding device is located on the same plane.

10. The die bonding method with corner or side contact without impact force according to claim 1, wherein in step (a), a first surface of a carrier device has a plurality of dies, and the die bonding device picks up one of the dies from the carrier device; in the step (b), the die bonding device moves from a side of the carrier device to a side of the substrate and stays at a first position, and the die bonding device moves from the first position to the substrate and stays at a second position; when the die bonding device is at the second position, a distance between the die and the substrate can provide the die to generate the bonding wave after contacting the substrate.

11. A die bonding method with corner or side contact without impact force, comprising the following steps:
    (a) a die bonding device picking up a die, and the die being free of solder and bump on surface;
    (b) the die bonding device moving the die to one side of a die placement area of a substrate, and the substrate being free of solder and bump on surface;
    (c) the die bonding device blowing one corner or one side of the die by a positive pressure, thereby bending the corner or the side of the die to contact the die placement area;
    (d) forming a bond wave after the corner or the side of the die contacting the die placement area, and spreading the bond wave from the corner of the die to opposite corner of the die or from the side of the die to opposite side of the die, then the positive pressure gradually weakening and further switching to a negative pressure, so that the die separating from the die bonding device gradually and becoming bonded on the die placement area; and (e) the die being bonded on the die placement area completely.

12. The die bonding method with corner or side contact without impact force according to claim 11, wherein in step (a), a corner or a side and the rest of the die bonding device uses a negative pressure to adsorb the corner or the side and the rest of the die, bond the die, and pick up the die;

in step (b), the corner or the side and the rest of the die bonding device continue using the negative pressure to adsorb the corner or the side and the rest of the die, and bond the die;

in step (c), the corner or the side of the die bonding device is switched from using the negative pressure adsorbing the corner or the side of the die to using the positive pressure to blow on the corner or the side of the die, while the rest of the die bonding device still maintains the negative pressure to adsorb the rest of the die;

in the step (d), the corner or the side of the die bonding device switches from using the negative pressure to adsorb the corner or the side of the die to using the positive pressure to blow on the corner or the side of the die and the switching is proceed gradually sequentially towards the opposite corner or the opposite side of the die, and a pressure difference fluctuation is generated, the pressure difference fluctuation further makes the corner or the side of the die forming a bonding wave after contacting the die placement area, and then the bonding wave is guided to expand diagonally from the corner or the side of the die towards the opposite corner or the opposite side, then the positive pressure at the corner or the side of the die bonding device blows on the corner or the side of the die is gradually weakened and further switched to the negative pressure, and the weakening and switching of the positive pressure to negative pressure is performed in sequence, so that the die is gradually separated from the die bonding device and bonded on the die placement area.

13. The die bonding method with corner or side contact without impact force according to claim 12, wherein the die bonding device has a plurality of air holes, and the air holes are connected to a vacuum device and an air supply device, and the vacuum device evacuates the air holes to generate a vacuum so that the negative pressure is provided, the negative pressure adsorbs the die through the air holes, the air supply device blows into the air holes to generate an air flow and provides the positive pressure, and the positive pressure blows on the die through the air holes.

14. The die bonding method with corner or side contact without impact force according to claim 13, wherein the die bonding device has two air holes, and the air holes respectively penetrate two corners of the bottom surface of the die bonding device, and the two corners are diagonal.

15. The die bonding method with corner or side contact without impact force according to claim 13, wherein the die bonding device has four air holes, and the air holes respectively penetrate four corners of the bottom surface of the die bonding device.

16. The die bonding method with corner or side contact without impact force according to claim 13, wherein the die bonding device has six air holes, four of the air holes respectively penetrate four corners of the bottom surface of the die bonding device, and the other two air holes respectively penetrate through the two opposite sides of the bottom surface of the die bonding device and are respectively located between two adjacent corners.

17. The die bonding method with corner or side contact without impact force according to claim 13, wherein the die bonding device has nine air holes, four of the air holes respectively penetrate four corners of the bottom surface of the die bonding device, and the other four air holes respectively penetrate through the four sides of the bottom surface of the die bonding device and are located between each pair of the adjacent corners, and one of the air holes penetrates the center of the bottom surface of the die bonding device.

18. The die bonding method with corner or side contact without impact force according to claim 13, wherein a recess is formed on the bottom surface of the die bonding device, the area of the recess is smaller than the area of the die, and the air holes communicate with the recess.

19. The die bonding method with corner or side contact without impact force according to claim 13, wherein a recess and a plurality of protruding bumps are formed on the bottom surface of the die bonding device, the protrusions are located in the recess, and the protrusions and the bottom surface of the die bonding device is located on the same plane.

20. The die bonding method with corner or side contact without impact force according to claim 11, wherein in step (a), a first surface of a carrier device has a plurality of dies, and the die bonding device picks up one of the dies from the carrier device; in the step (b), the die bonding device moves from a side of the carrier device to a side of the substrate and stays at a first position, and the die bonding device moves from the first position to the substrate and stays at a second position; when the die bonding device is at the second position, a distance between the die and the substrate can provide the die to generate the bonding wave after contacting the substrate.

\* \* \* \* \*